United States Patent
Kurz (12)

(10) Patent No.: US 6,259,609 B1
(45) Date of Patent: Jul. 10, 2001

(54) SHIELDING CONTACTOR CONSTRUCTION

(76) Inventor: Arthur A. Kurz, Wildlife Run, New Vernon, NJ (US) 07976

( * ) Notice: Subject to any disclaimer, the term of this patent is extended or adjusted under 35 U.S.C. 154(b) by 0 days.

(21) Appl. No.: 09/526,288

(22) Filed: Mar. 15, 2000

(51) Int. Cl.$^7$ ................................................. H05K 9/00
(52) U.S. Cl. ......................... 361/818; 361/816; 361/753; 174/35.51 R
(58) Field of Search .................. 361/818, 799, 361/424, 816, 822, 789, 753; 174/35 R, 35 GC, 35.51 R; 277/637

(56) References Cited

U.S. PATENT DOCUMENTS

| | | |
|---|---|---|
| 2,317,813 | 4/1943 | Schoenborn . |
| 2,580,321 | 12/1951 | Rees . |
| 4,262,986 | 4/1981 | Cherian et al. . |
| 4,941,853 | 7/1990 | Harwath . |
| 5,053,924 | 10/1991 | Kurgan . |
| 5,566,055 | 10/1996 | Salvi, Jr. . |
| 5,596,170 | 1/1997 | Barina et al. . |
| 5,682,299 | 10/1997 | Kunert . |
| 5,748,455 | * 5/1998 | Phillips et al. ........................ 361/818 |
| 5,856,632 | * 1/1999 | Bostrom et al. ................ 174/35 GC |
| 5,867,371 | 2/1999 | Denzene et al. . |
| 5,917,710 | 6/1999 | Määttä . |
| 5,929,376 | * 7/1999 | Doun et al. ......................... 174/35 R |
| 5,957,465 | * 9/1999 | Gonsalves et al. ................... 277/637 |

* cited by examiner

Primary Examiner—Jayprakash N. Gandhi
Assistant Examiner—Thanh Y. Tran
(74) Attorney, Agent, or Firm—Arthur Jacob

(57) ABSTRACT

A shielding contactor device in which a longitudinally extending strip of electrically conductive material carries a plurality of contactors having contact arms extending longitudinally along the strip, each contact arm having a contact finger spaced altitudinally from the strip, is provided with an improvement wherein the contact finger extends from the contact arm to establish a generally L-shaped contactor and the contact arm is twisted in permanent deformation for torsionally biasing the contact finger in the altitudinal direction.

10 Claims, 3 Drawing Sheets

SHIELDING CONTACTOR CONSTRUCTION

BACKGROUND OF THE INVENTION

The present invention relates generally to shielding arrangements for shielding against electromagnetic and radio frequency interference in electronic equipment and pertains, more specifically, to improvements in the construction of shielding gaskets utilized in such equipment.

A wide variety of shielding gaskets currently is available for use in connection with electronic equipment such as computers, wireless telephones and various other information and communication apparatus. Many of these shielding devices are constructed of relatively thin flexible sheets of metal and utilize spring contactors for making electrical contact at multiple locations to effect ground connections in various shielding arrangements. These spring contactors usually are in the form of cantilever spring tabs or fingers biased into contact with surrounding structures by simple bending. Appropriate contact forces generally are attained either by selecting the length of the cantilever arm, or by modifying the cross-sectional configuration of the arm to provide bending characteristics which will attain the desired contact forces. For example, deflection forces are reduced, while effective contact pressure is maintained, by increasing the length of a cantilever contactor arm. However, increased contactor arm length tends to increase stresses at the base of the contactor arm, leading to early mechanical failure and loss of electrical integrity. Modification of the cross-sectional configuration of a contactor arm often leads to a weaker, generally more flimsy gasket construction, and usually one which is more difficult to manufacture, and therefore more expensive. Moreover, the deflection of cantilever contactor arms results in increased contact area, thereby departing further from a more desirable limited point or edge contact and decreasing shielding effectiveness.

Shielding gaskets also have been constructed of elastomeric materials, usually using foamed structures rendered conductive by the incorporation of metal fibers either woven into or around the elastomeric material. The forces required to compress such a shielding gasket usually are much greater than those required for a comparable thin metal gasket because the load is distributed over a much greater area than the point or edge contacts encountered at the spring fingers of a thin metal gasket. Moreover, elastomeric gaskets are prone to oxidation and thermal degradation, both of which will lead to loss of resiliency and concomitant loss of shielding effectiveness.

BRIEF SUMMARY OF THE INVENTION

The present invention provides an improvement in a shielding gasket of the type constructed of a relatively thin sheet of metal, such as stainless steel, the improvement overcoming the shortcomings of thin sheet shielding gaskets which utilize cantilever contactor arms. As such, the present invention attains several objects and advantages, some of which are summarized as follows: Provides improved shielding against electromagnetic and radio frequency interference in electronic devices utilizing a shielding gasket requiring reduced forces for attaining and maintaining effective shielding contact; attains full deflection of the contactors of shielding arrangements with reduced force and without deleterious permanent deformation, for long-term consistent and intimate shielding contact; resists permanent deformations which otherwise could defeat effective shielding contact; assures highly localized contact between the contactors and surrounding structure for effective shielding contact; allows a more compact arrangement with increased shielding effectiveness; enables effective shielding arrangements in connection with circuit boards carrying a dense population of components by utilizing relatively narrow strips carrying contactors, the narrow strips having the ability to follow corresponding narrow traces along such densely populated circuit boards, which traces are to be contacted for shielding purposes; increases longevity through a decreased tendency toward contactor failure and consistent contact force over repeated deflections; enables widespread use in connection with a wider variety of shielding gasket configurations; provides a more rugged, stable and consistent shielding connection over a longer service life.

The above objects and advantages, as well as further objects and advantages, are attained by the present invention which may be described briefly as an improvement in a shielding contactor device in which a relatively thin flexible strip of electrically conductive material extends in a longitudinal direction and has a lateral width between laterally opposite first and second edges, a plurality of contactors extend longitudinally along the strip adjacent the first edge and project in an altitudinal direction from the strip, and a web extends longitudinally along the strip alongside each contactor adjacent the second edge, the improvement comprising: at least some of the contactors each including a contact arm having a length extending longitudinally along a longitudinal axis between a first end and a second end, and a width extending laterally between a first side and a second side, the first end of the contact arm being integral with the strip and the contact arm extending longitudinally adjacent the first edge of the strip, with the longitudinal axis being adjacent the first edge of the strip; and a contact finger adjacent the second end of the contact arm, spaced longitudinally from the first end of the contact arm, and extending laterally from the contact arm in a direction from the first edge toward the second edge of the strip, the contact finger including a contact portion spaced laterally from the longitudinal axis; the contact arm being twisted in permanent deformation about the longitudinal axis for extending the contact portion of the contact finger in the altitudinal direction and torsionally biasing the contact portion in the altitudinal direction.

In addition, the present invention includes an improvement in a method for making a shielding contactor device in which a relatively thin flexible strip of electrically conductive material extends in a longitudinal direction and has a lateral width between laterally opposite first and second edges, a plurality of contactors extend longitudinally along the strip adjacent the first edge and project in an altitudinal direction from the strip adjacent the first edge, a web extends longitudinally along the strip alongside each contactor adjacent the second edge, and at least some of the contactors each include a contact arm having a length extending longitudinally along a longitudinal axis between a first end and a second end, and a width extending laterally between a first side and a second side, the first end of the contact arm being integral with the strip and the contact arm extending longitudinally adjacent the first edge of the strip, with the longitudinal axis adjacent the first edge of the strip, the improvement comprising: providing a contact finger adjacent the second end of the contact arm, spaced longitudinally from the first end of the contact arm, and extending laterally from the contact arm in a direction from the first edge toward the second edge of the strip, the contact finger including a contact portion spaced laterally from the longitudinal axis; and twisting the contact arm to permanently deform the contact arm about the longitudinal axis for extending the contact portion of the contact finger in the altitudinal direction and torsionally biasing the contact portion in the altitudinal direction.

BRIEF DESCRIPTION OF THE SEVERAL VIEWS OF THE DRAWING

The invention will be understood more fully, while still further objects and advantages will become apparent, in the following detailed description of preferred embodiments of the invention illustrated in the accompanying drawing, in which.

DETAILED DESCRIPTION OF THE INVENTION

Figure 1:
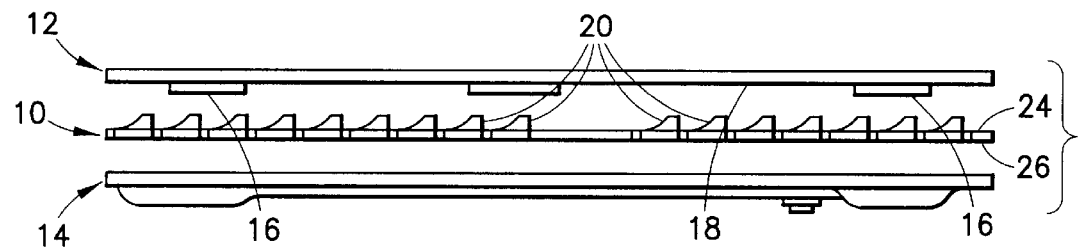
FIG. 1 is an exploded elevational view showing an assembly utilizing a shielding gasket incorporating an improvement of the present invention.

Referring now to the drawing, and especially to FIG. 1 thereof, a shielding contactor device constructed in accordance with the present invention is illustrated in the form of a shielding gasket 10 shown being placed between a printed circuit board 12 and a metal shield 14 in order to ensure that there will be no significant leakage of electromagnetic radiation or radio frequency radiation at the interface between the printed circuit board 12 and the metal shield 14. Circuit board 12 carries a plurality of components 16 and traces 18. As is now conventional in shielding gaskets, the present shielding gasket 10 is provided with a multiplicity of contactors 20 formed unitary with the shielding gasket 10 and projecting altitudinally for effecting the desired electrical contact between the shielding gasket 10 and corresponding traces 18 on the printed circuit board 12.

Figure 2:
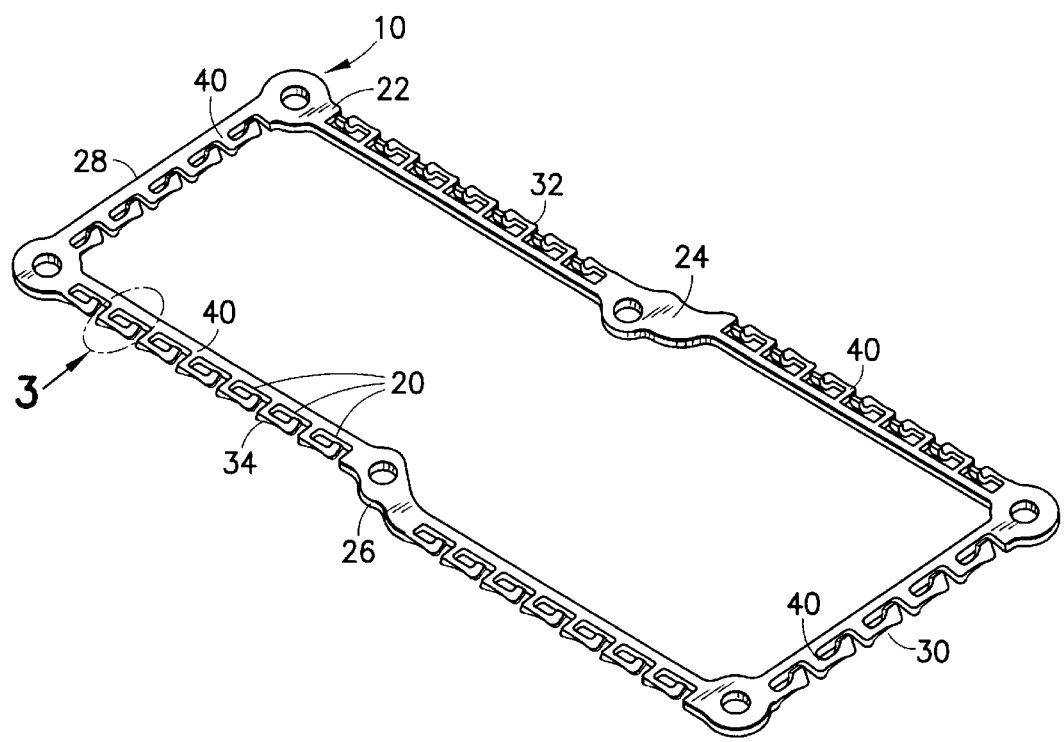
FIG. 2 is a perspective view of the shielding gasket.
Figure 3:
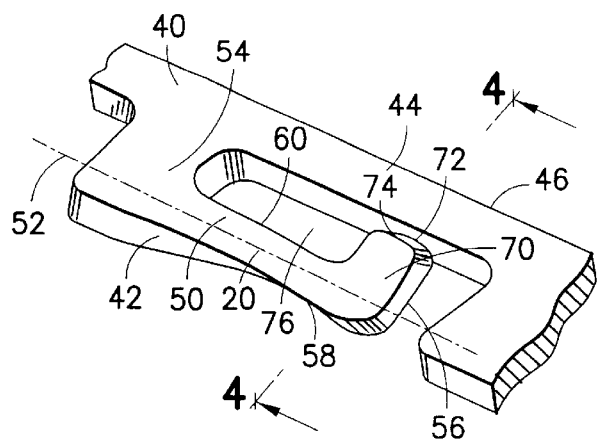
FIG. 3 is an enlarged fragmentary perspective view of the portion 3 of FIG. 2.

Turning now to FIG. 2, shielding gasket 10 is constructed of a relatively thin flexible sheet 22 of electrically conductive material, such as stainless steel, preferably having an altitudinal thickness of about 0.004 to 0.006 inch between opposite faces 24 and 26, a longitudinal length between opposite ends 28 and 30, and a lateral width between opposite sides 32 and 34. A pattern of strips 40 in sheet 22 is laid out in accordance with the traces of the printed circuit board 12 to be followed. Each strip 40 carries a plurality of contactors 20 and, as best seen in FIG. 3, each contactor 20 projects in an altitudinal direction from the strip 40, adjacent a first edge 42 of the strip 40, and a web 44 extends longitudinally along the strip 40, alongside each contactor 20, adjacent a second edge 46 of the strip 40.

Contactor 20 includes a contact arm 50 having a length extending longitudinally along a longitudinal axis 52 between a first, or near end 54 and a second, or far end 56, and a width extending laterally between a first side 58 and a second side 60. The near end 54 of contact arm 50 is integral with the strip 40 and the longitudinal axis 52 extends along the contact arm 50 adjacent the first edge 42 of the strip 40. A contact finger 70 is located adjacent the far end 56 of the contact arm 50, spaced longitudinally from the near end 54 of the contact arm 50, and extends laterally from the contact arm 50 to a border 72, the contact finger 70 extending in a lateral direction from the first edge 42 of the strip 40 toward the second edge 44 such that contactor 20 is provided with a generally L-shaped configuration. Contact finger 70 includes a contact portion in the form of a contact edge 74 located at the border 72 of the contact finger 70. Contact arm 50 is spaced laterally from web 44 to establish a gap 76 located laterally between the contact arm 50 and the web 44, and the contact finger 70 extends from the contact arm 50 laterally over the gap 76.

Figure 4:
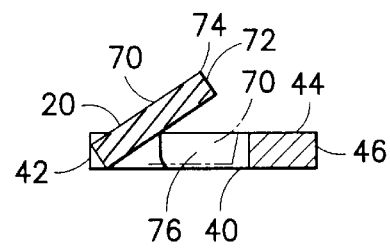
FIG. 4 is a cross-sectional view taken along line 4—4 of FIG. 3.

In order to attain effective electrical contact between the contact edge 74 and the printed circuit board 12, contact arm 50 is twisted in permanent deformation about the longitudinal axis 52 so as to extend the contact edge 74 of the contact finger 70 in the altitudinal direction, as shown in full lines in FIG. 4, and torsionally bias the contact edge 74 in the altitudinal direction. The torsional biasing force provided by the contact arm 50 enables a reduction in the force required to attain full deflection of the contact finger 70, as shown in phantom in FIG. 4, and concomitant full compression of the shielding gasket 10, while still retaining the degree of elasticity in contact arm 50 necessary to maintain elastic deflection without significant permanent, or plastic, deformation throughout the cycles of deflection experienced during service. Thus, while conventional cantilever contact arms are deflected in simple bending, inducing concentrated bending stresses at the base of the contact arm and concomitant permanent deformation which affects the ability of the contact arm to continue to exert the necessary contact forces throughout the cycles of operation encountered during service, the torsion spring construction provided in contact arm 50 distributes the energy of deflection evenly throughout the length of the contact arm 50, thereby enabling full deflection without plastic deformation. In addition, shielding is improved by intimate and effective electrical contact between the shielding gasket 10 and the printed circuit board 12 throughout the full deflection cycle of the contact arm 50, by virtue of confining such electrical contact to the contact edge 74 of the contact finger 70, thereby maintaining a very small area of contact throughout the deflection cycle. Such a highly localized contact provides consistent intimate contact, as opposed to prior cantilever contact arms where the area of contact increases as the contact arm approaches full deflection, with consequent lessening of the effectiveness of the contact force exerted by the contact arm. Moreover, the torsion spring construction provides a more compact arrangement, enabling the utilization of a strip 40 which has a relatively narrow lateral width between edges 42 and 46, the narrow lateral width of strip 40 having the ability to follow narrow traces 18 encountered along circuit board 12, which narrow traces 18 are to be contacted by the contactors 20. Such a compact arrangement provides the advantage of allowing a denser population of components 16 on circuit board 12, while maintaining the required shielding.

Figure 5:
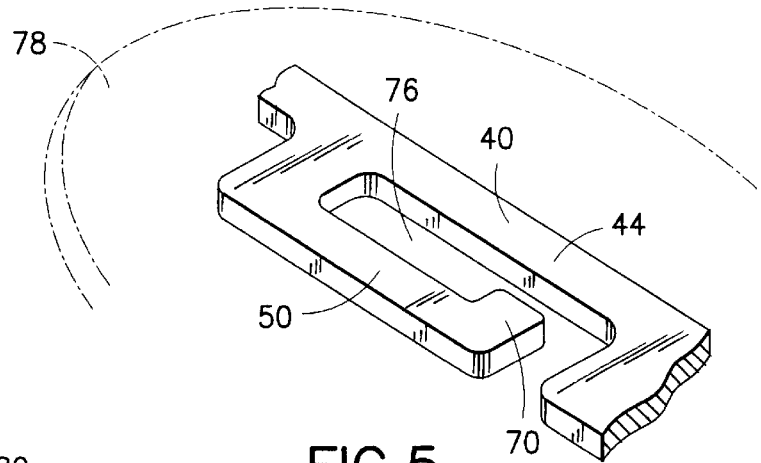
FIG. 5 is a fragmentary perspective view showing an intermediate stage in the manufacture of the improvement of FIGS. 1 through 4.

As seen in FIG. 5, contact arm 50, web 44 and contact finger 70 preferably are formed by blanking the plan configuration of shielding gasket 10 from a larger sheet, indicated at 78. Subsequently, contact arm 50 is twisted into the permanently deformed configuration best illustrated in FIGS. 3 and 4. Typically, where the thickness of sheet 78 is about 0.004 to 0.006 inch, contact edge 74 is raised altitudinally above face 24 by an altitudinal distance of about 0.020 inch.

Figure 6:
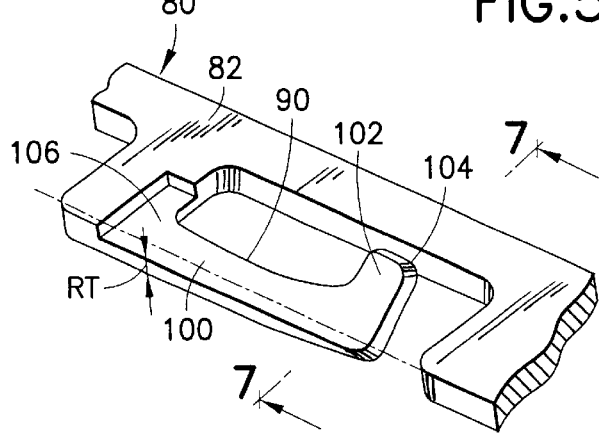
FIG. 6 is a fragmentary perspective view similar to FIG. 3, and showing another embodiment.
Figure 7:
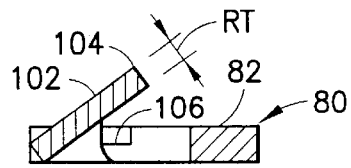
FIG. 7 is a cross-sectional view taken along line 7—7 of FIG. 6.

Referring now to FIG. 6, an alternate construction is illustrated wherein a shielding gasket 80 includes a strip 82, corresponding to strip 40 of shielding gasket 10. The strip 82 carries a plurality of contactors, one of which is illustrated at 90. Contactor 90 includes a contact arm 100, similar to contact arm 50, and a contact finger 102, similar to contact finger 70, the contact finger 102 including a contact edge 104. However, in the present embodiment, contact arm loo and contact finger 102 are coined along area 106, subsequent to blanking contactor 90 from a sheet, thereby providing contact arm 100 and contact finger 102 with a reduced cross-sectional thickness RT, as seen in FIG. 7. The coining operation enhances the spring properties of the material so that the coined structure concomitantly enhances the torsional performance of the contact arm 100 and provides added stiffness to contact finger 102 for assuring intimate electrical contact localized at the contact edge 104. In this manner, properties of the material selected for the sheet from which contactor 90 is blanked render the sheet suitable for blanking, while the subsequent coining provides the contact arm 100 and contact finger 102 with enhanced properties suitable for functioning as a torsion spring and contact.

Figure 8:
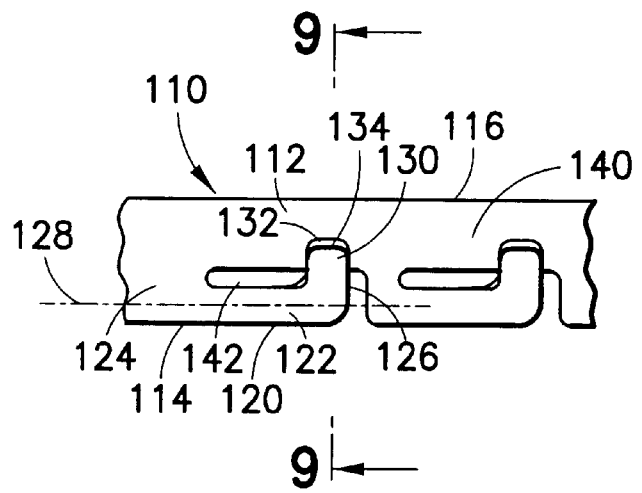
FIG. 8 is a plan view illustrating another embodiment of the improvement of the present invention.
Figure 9:
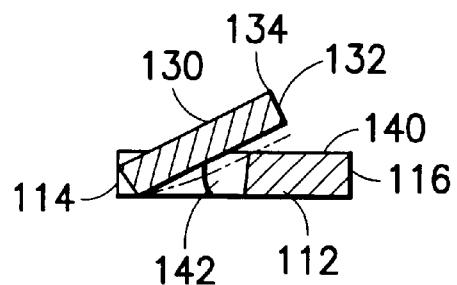
FIG. 9 is a cross-sectional view taken along line 9—9 of FIG. 8.
Figure 10:
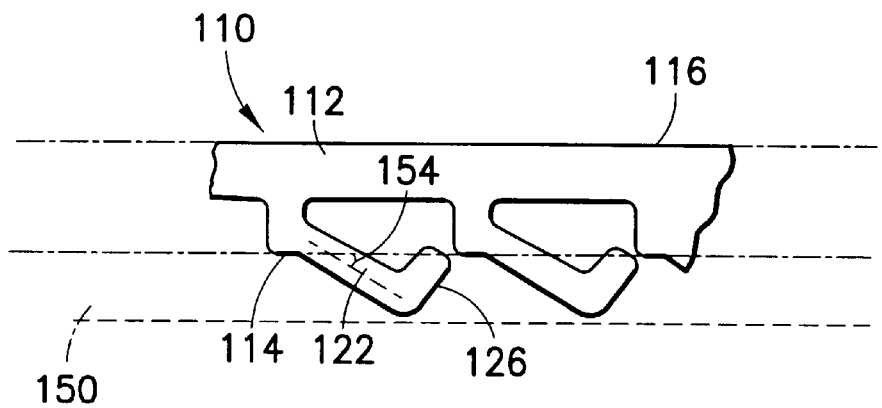
FIG. 10 is a fragmentary perspective view showing an intermediate stage in the manufacture of the improvement of FIGS. 8 and 9.

Turning now to FIGS. 8 through 10, another embodiment of the present invention is shown in the form of a shielding gasket 110 including a strip 112 having a lateral width between a first edge 114 and a second edge 116, the strip 112 carrying a plurality of contactors, one of which is illustrated at 120. As before, contactor 120 includes a contact arm 122 integral with the strip 112 at the near end 124 of the contact arm 122 and extending longitudinally along the strip 112 to a far end 126, the contact arm 122 having a longitudinal axis 128 and carrying a contact finger 130 which extends laterally from the far end 126 to a border 132. Contact finger 130 includes a contact portion in the form of a contact edge 134 at the border 132. A web 140 extends longitudinally adjacent the contact arm 122 and a gap 142 separates the contact arm 122 from the web 140. Contact arm 122 is twisted about the longitudinal axis 128 to extend the contact edge 134 in the altitudinal direction and to torsionally bias the contact edge in the altitudinal direction.

Whereas in the embodiment described above in connection with FIGS. 1 through 5 the contact finger 70 is blanked from material lying within the lateral width between the edges 42 and 46 of the strip 40 and, consequently, the lateral extent of the contact finger 70 is limited by the lateral width of the strip 40, the lateral extent of contact finger 130 is not so limited. Thus, contact finger 130 extends laterally across the gap 142 and overlaps the web 140, placing contact edge 134 altitudinally over web 140, as seen in FIGS. 8 and 9. Upon deflection of the contact finger 130 back toward the strip 112, during service, the contact finger 130 will be brought against the web 140, as illustrated in phantom in FIG. 9, and the shielding gasket 110 will be precluded from being compressed fully into the plane of the original sheet from which the shielding gasket 110 has been blanked. In this manner, shielding contact is enhanced. Moreover, deflections of the contact arm 122 are maintained well within the range of plastic deflection for long-term consistent intimate shielding contact.

Referring now to FIG. 10, strip 112 and contact arm 122 are blanked from sheet 150 having a lateral width greater than the width of strip 112. As blanked, contact arm 122 extends at an angle 154 to the longitudinal extent of strip 112, and the far end 126 of the contact arm 122 is located within an area 156 of sheet 150 which lies outside the area between the edges 114 and 116 of strip 112. In this manner, the lateral extent of contact finger 130 is not limited by the width of strip 112.

Subsequent to blanking, the contact arm 122 not only is twisted about axis 128, but also is bent laterally to bring the contact arm 122 into the longitudinal alignment illustrated in FIGS. 7 and 8, with the contact finger 130 overlapping the web 140 of the strip 112. The area 156 of sheet 150 remaining after the blanking operation may be discarded.

It will be seen that the present improvement attains all of the objects and advantages summarized above; namely: Provides improved shielding against electromagnetic and radio frequency interference in electronic devices utilizing a shielding gasket requiring reduced forces for attaining and maintaining effective shielding contact; attains full deflection of the contactors of shielding arrangements with reduced force and without deleterious permanent deformation, for long-term consistent and intimate shielding contact; resists permanent deformations which otherwise could defeat effective shielding contact; assures highly localized contact between the contactors and surrounding structure for effective shielding contact; allows a more compact arrangement with increased shielding effectiveness; enables effective shielding arrangements in connection with circuit boards carrying a dense population of components by utilizing relatively narrow strips carrying contactors, the narrow strips having the ability to follow corresponding narrow traces along such densely populated circuit boards, which traces are to be contacted for shielding purposes; increases longevity through a decreased tendency toward contactor failure and consistent contact force over repeated deflections; enables widespread use in connection with a wider variety of shielding gasket configurations; provides a more rugged, stable and consistent shielding connection over a longer service life.

It is to be understood that the above detailed description of preferred embodiments of the invention is provided by way of example only. Various details of design, construction and procedure may be modified without departing from the true spirit and scope of the invention, as set forth in the appended claims.

The embodiments of the invention in which an exclusive property or privilege is claimed are defined as follows:

1. An improvement in a shielding contactor device in which a relatively thin flexible strip of electrically conductive material extends in a longitudinal direction and has a lateral width between laterally opposite first and second edges, a plurality of contactors extend longitudinally along the strip adjacent the first edge and project in an altitudinal direction from the strip, and a web extends longitudinally along the strip alongside each contactor adjacent the second edge, the improvement comprising:

at least some of the contactors each including
  a contact arm having a length extending longitudinally along a longitudinal axis between a first end and a second end, and a width extending laterally between a first side and a second side, the first end of the contact arm being integral with the strip and the contact arm extending longitudinally adjacent the first edge of the strip, with the longitudinal axis being adjacent the first edge of the strip; and a contact finger adjacent the second end of the contact arm, spaced longitudinally from the first end of the contact arm, and extending laterally from the contact arm in a direction from the first edge toward the second edge of the strip, the contact finger including a contact portion spaced laterally from the longitudinal axis;

the contact arm being twisted in permanent deformation about the longitudinal axis for extending the contact portion of the contact finger in the altitudinal direction and torsionally biasing the contact portion in the altitudinal direction.

2. The improvement of claim 1 wherein the contact finger extends laterally from the contact arm to a border, and the contact portion of the contact finger includes a contact edge located at the border of the contact finger.

3. The improvement of claim 1 wherein the contact finger extends laterally from the contact arm such that the contactor includes a generally L-shaped configuration.

4. The improvement of claim 3 wherein the contact finger extends laterally from the contact arm to a border, and the contact portion of the contact finger includes a contact edge located at the border of the contact finger.

5. The improvement of claim 3 wherein the contact arm is spaced laterally from the web to establish a gap located laterally between the contact arm and the web, and the contact finger extends from the contact arm laterally over the gap.

6. The improvement of claim 5 wherein the contact finger extends laterally across the gap and overlaps the web.

7. The improvement of claim 1 wherein the strip has a predetermined altitudinal thickness and the contact arm has a coined thickness less than the predetermined thickness.

8. An improvement in a method for making a shielding contactor device in which a relatively thin flexible strip of electrically conductive material extends in a longitudinal direction and has a lateral width between laterally opposite first and second edges, a plurality of contactors extend longitudinally along the strip adjacent the first edge and project in an altitudinal direction from the strip adjacent the first edge, a web extends longitudinally along the strip alongside each contactor adjacent the second edge, and at least some of the contactors each include a contact arm having a length extending longitudinally along a longitudinal axis between a first end and a second end, and a width extending laterally between a first side and a second side, the first end of the contact arm being integral with the strip and the contact arm extending longitudinally adjacent the first edge of the strip, with the longitudinal axis adjacent the first edge of the strip, the improvement comprising:

providing a contact finger adjacent the second end of the contact arm, spaced longitudinally from the first end of the contact arm, and extending laterally from the contact arm in a direction from the first edge toward the second edge of the strip, the contact finger including a contact portion spaced laterally from the longitudinal axis; and twisting the contact arm to permanently deform the contact arm about the longitudinal axis for extending the contact portion of the contact finger in the altitudinal direction and torsionally biasing the contact portion in the altitudinal direction.

9. The improvement of claim 8 wherein the strip has a predetermined altitudinal thickness and the improvement includes coining the contact arm to an altitudinal thickness less than the predetermined altitudinal thickness.

10. The improvement of claim 9 wherein the strip is blanked from a relatively thin flexible sheet of electrically conductive material having a lateral width greater than the lateral width of the strip, with the contact arm and the contact finger being blanked to extend laterally beyond the first edge of the strip, and the contact arm subsequently is bent in a lateral direction to be placed laterally between the first and second edges of the strip.

\* \* \* \* \*